US011742781B2

(12) United States Patent
Liu et al.

(10) Patent No.: US 11,742,781 B2
(45) Date of Patent: Aug. 29, 2023

(54) ELECTROSTATIC CHUCK WITH CHARGE DISSIPATION COATING

(71) Applicant: ENTEGRIS, INC., Billerica, MA (US)

(72) Inventors: Yan Liu, Lexington, MA (US); Jakub Rybczynski, Arlington, MA (US); Steven Donnell, Burlington, MA (US); Chun Wang Chan, Cambridge, MA (US)

(73) Assignee: ENTEGRIS, INC., Billerica, MA (US)

( * ) Notice: Subject to any disclaimer, the term of this patent is extended or adjusted under 35 U.S.C. 154(b) by 59 days.

(21) Appl. No.: 16/682,497

(22) Filed: Nov. 13, 2019

(65) Prior Publication Data
US 2020/0161158 A1 May 21, 2020

Related U.S. Application Data

(60) Provisional application No. 62/769,306, filed on Nov. 19, 2018.

(51) Int. Cl.
*H02N 13/00* (2006.01)
*H01L 21/683* (2006.01)
*B23Q 3/152* (2006.01)

(52) U.S. Cl.
CPC ............. *H02N 13/00* (2013.01); *B23Q 3/152* (2013.01); *H01L 21/6831* (2013.01); *H01L 21/6833* (2013.01)

(58) Field of Classification Search
CPC .......... H02N 13/00; B23Q 3/152; B23Q 3/15; H01L 21/6831; H01L 21/6833; H01L 21/6875; H01L 21/67126; H01L 21/6835

(Continued)

(56) References Cited

U.S. PATENT DOCUMENTS 5,382,311 A * 1/1995 Ishikawa ............. C23C 16/4586
118/728
5,522,131 A * 6/1996 Steger ................. H01L 21/6831
29/829

(Continued)

FOREIGN PATENT DOCUMENTS

EP 3073521 B1 4/2022
JP 2006287210 A 10/2006
(Continued)

*Primary Examiner* — Scott Bauer
*Assistant Examiner* — Sreeya Sreevatsa (57) ABSTRACT

An electrostatic chuck solves the problem of wafer sticking by providing conductive paths on raised embossments that are bridged together and are connected to ground that support the wafer substrate above the surface of the electrostatic chuck. Further, laterally spaced electrode patterns and electrode elements which are spaced laterally and longitudinally away from the raised embossments reduce or eliminate electrical coupling during wafer clamping between conductively coated embossments and the electrode elements, thereby creating a low resistance path for charges remaining on the wafer after declamping to promptly travel to ground. The conductive bridge and electrode pattern configuration also substantially reduces or eliminates any charge build up on the conductive bridge(s) during clamping in order that charge build up in "islands" (worn portions of the insulator layer of the main field area) do not affect the charge dissipation from the wafer substrate through the conductive bridges to ground.

13 Claims, 4 Drawing Sheets

(58) Field of Classification Search
USPC .......................................................... 361/234
See application file for complete search history.

(56) References Cited

U.S. PATENT DOCUMENTS

| | | | | |
|---|---|---|---|---|
| 7,586,734 | B2 * | 9/2009 | Kamitani | ............ H01L 21/6831 |
| | | | | 361/230 |
| 7,667,944 | B2 * | 2/2010 | Naim | ..................... H02N 13/00 |
| | | | | 361/230 |
| 7,848,077 | B2 * | 12/2010 | Mizuno | ............... H01L 21/6875 |
| | | | | 361/230 |
| 9,608,549 | B2 * | 3/2017 | Parkhe | ................ H01L 21/6833 |
| 9,692,325 | B2 | 6/2017 | Suuronen | |
| 2004/0040665 | A1 | 3/2004 | Mizuno | |
| 2007/0217117 | A1 | 9/2007 | Ohta | |
| 2013/0155569 | A1 * | 6/2013 | Suuronen | ............ H01L 21/6833 |
| | | | | 361/234 |
| 2016/0336210 | A1 * | 11/2016 | Cooke | ............... H01L 21/67248 |

FOREIGN PATENT DOCUMENTS

| | | | | |
|---|---|---|---|---|
| JP | 52932112 | A | | 7/2010 |
| JP | 6139698 | B2 | | 5/2017 |
| JP | 2017212332 | A | * | 11/2017 |
| JP | 2017212332 | A | | 11/2017 |

* cited by examiner

ELECTROSTATIC CHUCK WITH CHARGE DISSIPATION COATING

FIELD OF INVENTION

The invention is in the field of electrostatic chucks used to secure and support a wafer substrate during wafer processing.

BACKGROUND

Electrostatic chucks, also known as platens, are used to secure and support a workpiece for processing. Electrostatic charge may accumulate on the workpiece and also on the platen surface supporting the workpiece. Charge accumulated on the workpiece can be transferred to the platen surface, and charge accumulated on the platen surface can be transferred to the workpiece. Charge accumulation can cause workpiece "sticking" problems. In one instance, the charge accumulation can be so great that typical unclamping forces cannot release the workpiece. For example, a typical unclamping force may be provided by raising lift pins to contact the backside of the workpiece. In another instance, the lift pins may be able to lift a portion of the workpiece but a remaining portion remains in contact with the workpiece. When the workpiece is a disk shaped semiconductor wafer, the wafer may become "tilted" appearing stuck to an edge of the platen. When an associated robot arm attempts to retrieve the wafer, it may not properly engage the wafer and even push the wafer off the platen leading to possible wafer damage and interruptions in processing. Another workpiece "sticking" problem may be referred to as "dancing around the platen." In this instance, the workpiece may be clamped to the platen during processing or in a load position. With some circular or disk shaped workpieces such as a semiconductor wafer, the wafer may enter into a general oscillatory precession around the outer circumference of the platen creating great risk for dropping of the wafer. In other cases, "wafer walk" may occur, which may be caused by partial sticking of the wafer edge to the platen during lifting, resulting in a wobble of the wafer on the lift pins and possible misalignment on the pins leading to a wafer handling problem. Even if charge accumulation does not lead to workpiece "sticking" problems, it may lead to damage of devices being formed on the workpiece. In a plasma doping ion implanter where the workpiece is positioned in the same chamber as plasma, excessive charge accumulation can also lead to doping non-uniformities, micro-loading, and arcing. Hence, the throughput of the plasma doping ion implanter may be intentionally limited in some instances to avoid excessive charge accumulation.

One conventional solution to controlling charge accumulation uses three spring loaded grounding pins that contact a backside of the workpiece to provide a path to ground when the workpiece is in a clamped position. One drawback of this solution is that the spring loaded grounding pins are limited to three pins. As such, the effectiveness of this grounding arrangement to dissipate excessive charge build up is limited. Another drawback of this solution is that the contact points of the spring loaded grounding pins have sharp edges that can cause damage to the backside of the workpiece. Damage to the backside of the workpiece can also generate unwanted particles (contamination) which may be critical to limit in some processing applications. Accordingly, there is an ongoing need to improve the performance of electrostatic chucks.

SUMMARY

Unlike electrostatic chucks found in the prior art, the various embodiments described herein are applicable primarily to AC and DC Coulombic type chucks but can also include DC Johnsen-Rahbek (J-R) type chucks as well. In the various embodiments, the charge dissipation layer coating (or CDL coating) on an uppermost layer of the electrostatic chuck provides grounding for a wafer substrate that is placed thereon for charge dissipation. In contrast, some prior art devices use conductive coatings in order to reduce the clamping force between the wafer substrate and the embossment and to reduce particle generation on the surface of the electrostatic chuck which also interferes with declamping of the wafer substrate from the chuck surface as these designs attempt to decouple and reduce electrostatic forces between embossments on the chuck surface and the wafer substrate. The various CDL layers and associated CDL patterns described herein also are advantageously designed based on the electrode pattern formed below and underneath so as to avoid overlapping of CDL layers with electrode patterns below or underneath, thereby avoiding the forming of a clamping force between the electrodes and the CDL layers instead forming the clamping force between the electrodes and the wafer and up against the CDL layer. In some electrostatic chuck embodiments, a narrow lateral clearance is formed between the CDL layer and the electrode elements of the electrode layer to ensure that longitudinally there is no overlapping between portions of the CDL element and the electrode element of the respective layers/patterns. In prior art chuck designs such overlapping of conductive coating layers and the electrode pattern is not a concern and in some cases there are conductive material clearances only around the embossments to reduce the number of particles generated by potential friction between the wafer and the chuck surface and avoid a clamp force around the embossment in a DC J-R style electrostatic chuck. In some prior art devices, conductive wiring connecting the tops of embossments would be detrimental to the various embodiments disclosed herein as parts of the conductive wiring would in fact be located over various parts of the electrode patterns below and/or underneath causing undesirable interference due to the thin dielectric layers interposed between the CDL layer and the electrode pattern layer.

Grounding of the wafer, and the grounding mechanism as a whole, in the embodiments described herein is continuous and occurs through the CDL coating inside of the chuck body through hole and through to at least one outer edge of the chuck that extends to ground at or near the base of the chuck. Hence the various chuck embodiments also have continuous grounding as the CDL/electrode pattern does not interfere with the electrode(s) creating a clamping force on the wafer. In contrast, in prior art chucks grounding is provided by a metal piece or strip through a center through-hole and grounding of the wafer only occurs after a clamp voltage on the electrostatic chuck is turned off. In further contrast with prior art electrostatic chuck devices, various embodiments are described that provide for various wafer contact surface configurations including silicon-based embossments with a CDL layer formed thereon that are in contact with the wafer substrate; a CDL layer formed below or underneath the silicon based embossments that are in contact with the wafer; a CDL layer formed below or underneath the silicon-based embossment(s) with a top conductive carbon coating (having a substantially similar pattern as the CDL layer pattern below) that is in contact with the wafer substrate. Further, embedding conductive coating layers below or underneath semiconductor-based embossments and the field coating is provided for improved performance in AC Coulombic type electrostatic chucks.

In one example embodiment, there is provided an electrostatic chuck assembly for supporting a wafer substrate thereon during wafer processing, the chuck assembly including a main field area of a workpiece-contacting surface comprised of an insulative material forming a first insulator layer having a plurality of embossments formed thereon that extend above surrounding portions of the main field area, the plurality of embossments being disposed laterally in from an outside edge of the electrostatic chuck with each of the embossments having a conductive coating disposed thereon, the conductive coating configured to form one or more conductive bridges across sets of the embossments that are electrically coupled to ground, the first insulator layer of the main field area including gap portions of insulative material that are not conductively coated which are disposed between the embossments, wherein the plurality of conductively coated embossments are configured to support the wafer substrate over the main field and above the outside edge of the electrostatic chuck. The electrostatic chuck also includes a first electrode pattern disposed below or underneath the first insulator layer with the first electrode pattern having electrode elements located longitudinally below the gap portions of insulative material and located laterally between the conductive bridges of embossments, wherein distal portions of the conductor coated embossment do not extend laterally over the electrode elements so as to form a longitudinal clearance thereby preventing electrical coupling between the electrode pattern and the conductive bridges upon energization of the electrode pattern. An insulative body is also included that supports the first electrode pattern and the work-piece contacting surface having thereon the conductor coated embossments to form an operative electrostatic chuck assembly. In this embodiment, lateral spacing between a top of the conductor coated embossments and the electrode elements is configurable so as to maximize charge dissipation from the wafer substrate upon de-energization of the electrode pattern.

In another example embodiment, a method is provided for electrostatically clamping a wafer substrate to an electrostatic chuck while preventing the substrate from sticking to the electrostatic chuck after wafer processing, the method including the steps of providing an electrostatic chuck that includes a plurality of embossments disposed on and extending above a workpiece-contacting surface of the electrostatic chuck and at least one electrode pattern disposed below a first insulator layer. The method including the step of disposing the wafer substrate on the plurality of embossments having a conductive coating thereon, the conductor coated embossments disposed laterally in from an outside edge of the electrostatic chuck, the conductor coated embossments forming a conductive bridge that is electrically coupled to ground and which are in contact with the wafer substrate. The method also includes the step of energizing the electrode pattern to physically clamp the wafer substrate to the conductive bridge formed by the coated embossments, electrode elements of the one electrode pattern being disposed laterally away from the conductor coated embossments so as to form a longitudinal clearance which prevents electrical coupling between the electrode elements and the conductor coated embossments. In a related embodiment, the method further includes the step of forming gaps of insulative material between the conductor coated embossments and disposed longitudinally over the electrode elements so as to provide a low resistance path for charges to travel to ground after de-energizing the electrode pattern when declamping the substrate. In another related embodiment, the method includes the step of configuring lateral spacing between a top of the conductor coated embossments and the electrode elements so as to maximize charge dissipation from the wafer substrate upon de-energization of the electrode pattern.

In yet another example embodiment, there is a provided an electrostatic chuck assembly configured to support a wafer substrate thereon, the chuck assembly comprising: a workpiece-contacting surface including a main field area comprised of an insulative material forming a first insulator layer having at least one embossment formed thereon that extends above surrounding portions of the main field area, the at least one embossment being disposed laterally in from an outside edge of the electrostatic chuck with a conductive coating disposed thereon, the conductive coating electrically coupled to ground through a longitudinal through-hole in the electrostatic chuck, the first insulator layer of the main field area including gap portions of insulative material that are not coated with a conductive material which are disposed on either side of the at least one the embossment, wherein the conductor coated embossment is configured to support the wafer substrate over the main field and above the outside edge of the electrostatic chuck. The assembly also includes a first electrode pattern disposed below or underneath the first insulator layer having electrode elements located longitudinally below the gap portions of insulative material and located laterally away from the conductor coated embossment, wherein distal portions of the embossment conductive coating do not extend laterally over the electrode elements so as to form a longitudinal clearance thereby preventing electrical coupling between the electrode pattern and the conductor coated embossment upon energization of the electrode pattern. In a related embodiment, the conductive coating is one of a metallic material or a conductive charge dissipating material. The electrostatic chuck also provides a conductive path covering at least a portion of an outside edge of a workpiece-contacting surface of the electrostatic chuck, the conductive path comprising a conductive coating electrically coupled to an electrical path to ground.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention. In addition, it should be understood that, where components are shown adjacent to each other, they may make electrical contact with each other even though they are shown with some small amount of space between them in the drawings for purposes of clarity, as will be apparent from context in the description herein with reference to the drawings.

While the invention is amenable to various modifications and alternative forms, specific embodiments have been shown by way of example in the drawings and are described in detail below. The intention, however, is not to limit the invention to the particular embodiments described. On the contrary, the invention is intended to cover all modifications, equivalents, and alternatives falling within the scope of the invention as defined by the appended claims.

DESCRIPTION OF THE PREFERRED EMBODIMENTS

The following description provides various example embodiments of the novel wafer substrate declamping structure of an electrostatic chuck and a method for using such a configuration to reduce charge accumulation that leads to wafer substrate "sticking" after the electrostatic chuck has been de-energized. Localized surface charges may lead to unintended wafer clamping even in the absence of external electrical voltage. Accordingly, there is also a need for an improved platen or chuck configuration that controls charge accumulation in electrostatic chucks.

Figure 1:
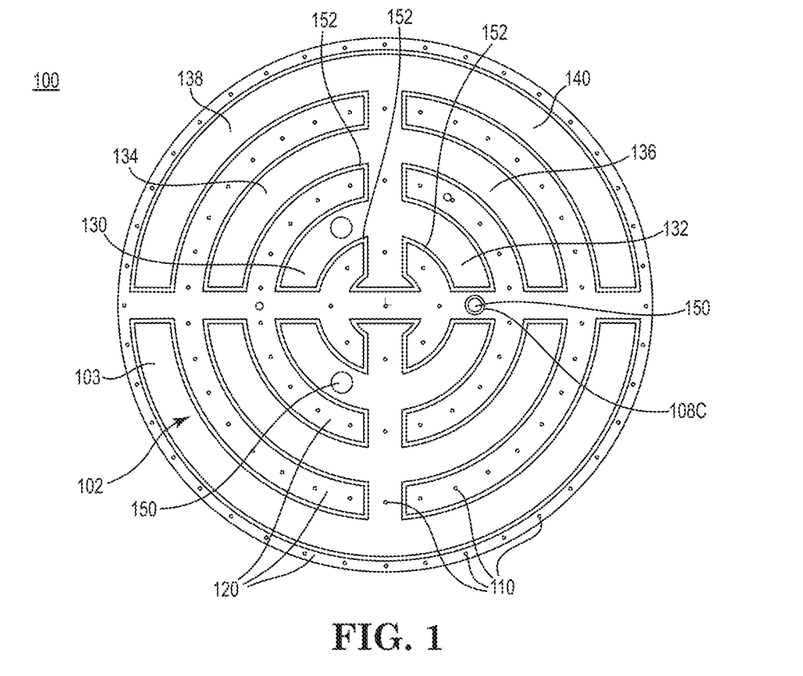
FIG. 1 is a top view of an electrostatic chuck in accordance with an embodiment of the invention.
Figure 2:
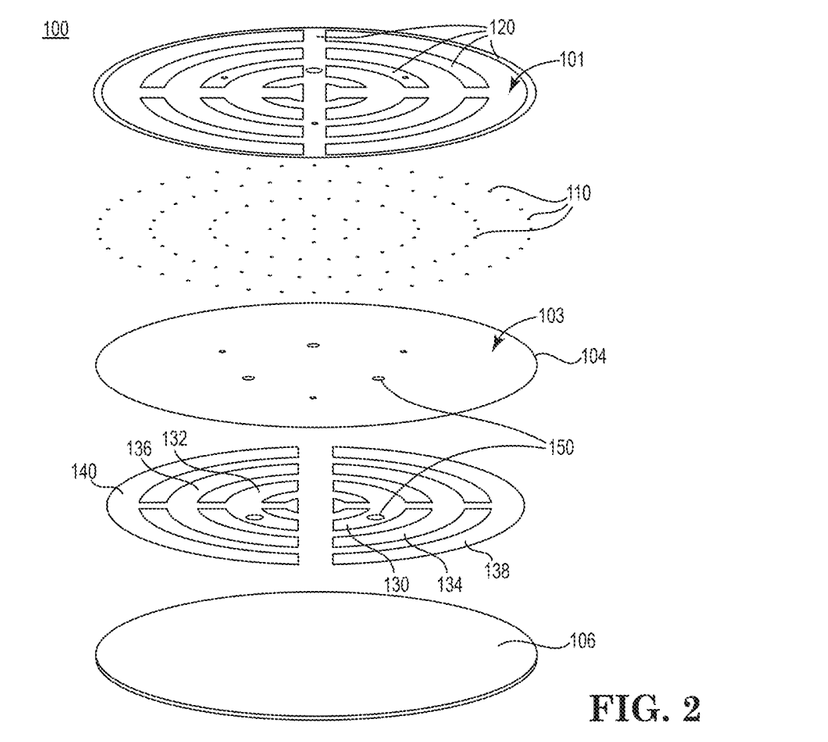
FIG. 2 is an exploded view of the electrostatic chuck of FIG. 1 illustrating various layers and an interleaving configuration of conductive paths and electrode patterns formed on and in a workpiece-contacting surface of the electrostatic chuck, in accordance with an embodiment of the invention.

Referring now to the Figures, in FIGS. 1 and 2 is a top view and exploded view, respectively, of an electrostatic chuck 100 designed to reduce "sticking" of a wafer substrate (increasing the difficulty of removing the wafer substrate from the electrostatic chuck), via a novel configuration and wafer clamping method, once an electrode pattern is de-energized so as to "unclamp" or declamp the wafer substrate from the electrostatic chuck after wafer substrate processing. Although there may be apparently similar structures that also reduce the sticking problem by providing conductive paths to channel charges to ground, the embodiments disclosed herein provide conductive paths on raised embossments that are bridged together and are connected to ground that support the wafer substrate above the electrostatic chuck's surface. Further, laterally spaced electrode patterns and electrode elements away from the raised embossments reduce or eliminate electrical coupling during wafer clamping between conductively coated embossments and the electrode elements, thereby creating a low resistance path for charges remaining on the wafer after declamping to promptly travel to ground. Such a novel conductive bridge and electrode pattern configuration also substantially reduces or eliminates any charge build up on the conductive bridge(s) during clamping in order that charge build up in "islands" (worn portions of the insulator layer of the main field area) do not affect or slow down the charge dissipation from the wafer substrate through the conductive bridges to ground.

Figure 3:
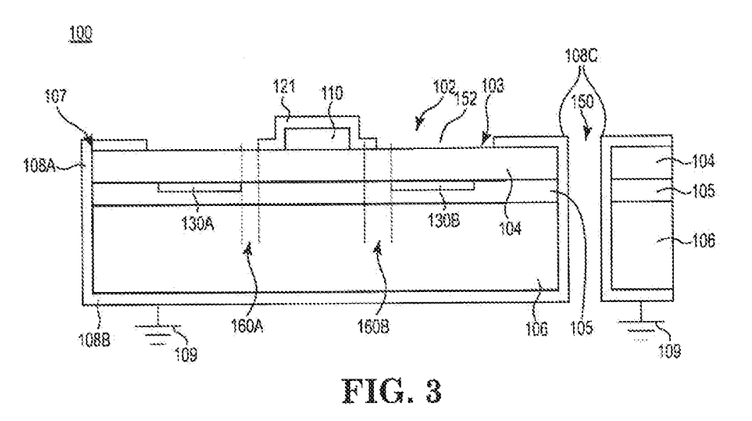
FIG. 3 is an enlarged side view of the electrostatic chuck of FIG. 1, which includes at least one embossment coated with a conductive coating and a conductive path located on an edge of the electrostatic chuck and coupled to a conductive grounding layer, in accordance with an embodiment of the invention.

Referring again to FIGS. 1 and 2 and now FIG. 3, electrostatic chuck 100 includes a main field area 102 comprised of an insulative material 104 that has a plurality of embossments 110 formed on a surface 103 of main field area 102. In one example embodiment, embossments 110 are formed from the same insulative material as the main field area 102 and in another embodiment the embossments are formed from another insulative material, or any other suitable material depending on the application, to form the embossments. Chuck 100 further includes conductive bridges 120 formed from a conductive coating, such as a metallic coating or a coating made from a material having charge dissipation properties, which is formed over one or more embossments 110. In this example embodiment, conductive bridges 120 are physically and electrically coupled to a conductor path 108C through one or more center through-holes 150 that are formed through the body of chuck 100, such center holes 150 being lined with conductor path 108C that is coupled to ground 109 or to a grounding layer below 108B.

In this example embodiment, chuck 100 further includes a first electrode pattern 130 formed in main field area 102 and below a top surface 103 of insulative layer 104 of main field area 102 with a second electrode pattern 132 also being formed in main field area 102 and below top surface 103 of main field area 102. First and second electrode patterns 130 and 132 are used to clamp a wafer substrate to the surface of electrostatic chuck 100 when they are individually energized. In this example embodiment, chuck 100 also includes a third electrode pattern 134 and a fourth electrode pattern 136, which are adjacent to the first and second electrode patterns, and are formed in insulative layer 104 below top surface 103 of main field area 102. There is also included in this example embodiment of chuck 100 a fifth electrode pattern 138 and a sixth electrode pattern 140, which are adjacent to the third and fourth electrode patterns, and are formed in insulative layer 104 below top surface 103 of main field area 102. In chuck 100, conductive bridges 120 with embossments 110 are formed in a radial pattern, along with the various electrode patterns, but the present invention is not necessarily limited to such an electrode and conductive bridge pattern or configuration. Further, the various embodiments disclosed herein are not limited to a certain number of electrode patterns and electrode elements as this is driven by the wafer processing requirements.

Referring to FIGS. 1-3, there is illustrated an enlarged view of electrostatic chuck 100 illustrating an interleaving configuration of conductive bridges or paths 120 and electrode patterns 130 and 132 formed in insulative layer 104 and in a workpiece-contacting surface 101 of electrostatic chuck 100. Although the tops of embossments 110 are shown as dots, the embossment tops or caps are coated with a metallic or charge dissipative coating as part of conductive bridges 120. Gaps of insulative material 152 (forming a clearance) are formed between the conductor coated embossments 110 and the gaps are disposed longitudinally over the electrode elements, such as elements 130A and 130B. Insulative material gaps 152 provide an area or clearance above which the wafer substrate is clamped to chuck 100 when the electrode elements are energized and a coupling force is formed by the electrode elements below.

Referring again to FIG. 3, there is illustrated an enlarged side view of a portion of electrostatic chuck 100. In this example embodiment, chuck 100 is formed from successive layers of a dielectric (such as a ceramic material) 104, a bond layer (e.g., polymer or other type of adhesive) 105 shown in FIG. 3 but not FIG. 2 for clarity purposes) and a second insulator layer (ceramic substrate) 106. Embossment 110 is formed on main field area 102 over a first insulator layer 104 having a top surface 103. Embossment 110 is coated with a conductive coating 121 and chuck 100 includes a conductive path 108A located on an edge 107 of electrostatic chuck 100 which is coupled to a conductive grounding layer 108B and in turn is coupled to a ground 109. Conductive grounding layer 108B is disposed below or underneath a second insulator layer 106 of the electrostatic chuck, the conductive grounding layer electrically contacting at least one conductive bridge of embossments 110. In this example embodiment, there is lateral spacing 160A between the layer of coating 121 on a side of embossment 110 and the electrode element 130A, the spacing relationship being configurable so as to maximize charge dissipation from the wafer substrate upon de-energization of the electrode pattern. In a related example, lateral spacing 160B represents the spacing or clearance (see gap 152 above) between a distal part of electrode 130B and a distal portion of conductive coating 121 on embossment 110. In one example embodiment, the conductive grounding layer 108B electrically contacts a grounding pin or member (not shown) of the electrostatic chuck.

Referring again to FIGS. 1-3, electrostatic chuck or chuck assembly 100 is designed to support a wafer substrate thereon and in particular, having the plurality of embossments supporting the wafer substrate over the main field area and above the edge of chuck 100. The plurality of embossments 110 are disposed laterally in from an outside edge 107 of the electrostatic chuck with each of the embossments 110 having a conductive coating 121 disposed thereon, the conductive coating configured to form one or more conductive bridges 120 across sets of the embossments 110 that are electrically coupled to ground 109, the first insulator layer 104 of the main field area 102 including gap portions 152 of insulative material that are not conductively coated which are disposed between the embossments 110. First electrode pattern 130 disposed below or underneath the first insulator layer 104 has electrode elements 130A and 130B that are located longitudinally below the gap portions 152 of insulative material and are located laterally between the conductive bridges 120 of embossments 110, with distal portions of the embossment conductive coating not extending laterally over electrode elements 130A and 130B, thereby preventing electrical coupling between the electrode pattern and the conductive bridges upon energization of the electrode pattern. In one example embodiment, at least one of the conductive bridges 120 is electrically coupled to one of the conductive grounding layer 108B or ground 109 through a longitudinal hole 150 in electrostatic chuck 100.

In this embodiment, electrostatic chuck 100 optionally includes a conductive path 108 covering at least a portion of outside edge 107 of workpiece-contacting surface 101 of electrostatic chuck 100 with the conductive path 108A including a conductive coating electrically coupled to the conductive grounding layer 108B. In a related embodiment, electrostatic chuck 100 includes a gas seal ring (not shown) on the workpiece-contacting surface 101 with the conductive path covering 108A at least a portion of the gas seal ring of electrostatic chuck 100. In various example embodiments, the conductive path includes one of a carbon-based material, doped carbon-based material, or hydrogenated carbon doped with nitrogen material. In various embodiments the main field area 102 comprises one of a silicon-based and a polymer-based material.

The above mentioned electrostatic chuck configurations also provide for a unique method of clamping a wafer substrate to the electrostatic chuck that can address issues of worn electrostatic chucks or can extend the manufacturing run for a user in not having to cease operations due to worn chucks that have "islands" of charges formed between embossments and conductive bridges 120 or embossments 110. Hence, a method is provided for electrostatically clamping a wafer substrate to electrostatic chuck 100 while preventing the substrate from sticking to the electrostatic chuck after wafer processing, electrostatic chuck 100 including a plurality of embossments 110 disposed on top surface 103 of main field area 102 and extending above a workpiece-contacting surface 101 of the electrostatic chuck and at least one electrode pattern 130, with electrode elements 130A and 130B, disposed below or underneath a first insulator layer 104. The method includes the steps of disposing the wafer substrate on the plurality of embossments 110 having a conductive coating thereon 121, the conductor coated embossments 110 disposed laterally in from an outside edge 107 of electrostatic chuck 100, the conductor coated embossments 110 forming a conductive bridge 120 that is electrically coupled to ground 109 and which are in contact with the wafer substrate. The method also includes the step of energizing the electrode pattern 130 to physically clamp the wafer substrate to the conductive bridge 120 formed by the coated embossments 110, electrode elements 130A and 130B of the electrode pattern being disposed laterally away from the conductor coated embossments 110 to prevent electrical coupling between the electrode elements and the conductor coated embossments. In a related embodiment, the method further includes the step of forming gaps of insulative material 152 between the conductor coated embossments 110 and with insulative gaps 152 disposed longitudinally over each of the electrode elements 130A and 130B. Insulative material gaps 152 provide an area above which the wafer substrate is clamped to chuck 100 when the electrode elements are energized and a coupling force is formed and applied to the wafer. Advantageously, conductor coated embossments 110 provide a low resistance path for charges to travel to ground via path conductive bridge 120 after de-energizing the electrode pattern when declamping the substrate since the embossments do not clamp or couple with the electrode elements when energized. In another related embodiment, the method includes the step of configuring lateral spacing 160A between a top of the conductor coated embossments 110 and the electrode elements 130A (or 130B) so as to maximize charge dissipation from the wafer substrate upon de-energization of the electrode pattern. In a related embodiment, the lateral spacing is 160B which is the space from a distal end of the conductive coating to an edge of electrode 130B disposed below.

The conductive path or bridge 120 may, for example, be made of carbon-based material having a thickness of about 0.1 to 3 microns, which may be doped to achieve an appropriate surface resistivity. For example, the conductive coating may have a surface resistivity of less than about $10^7$ ohms per square, measured between the carbon-based coating and ground, for example a surface resistivity of between about $10^5$ ohms per square and about $10^7$ ohms per square. The conductive path may also, for example, be made of a film of hydrogenated carbon doped with nitrogen, of a thickness of about 0.1 to 3 microns. The conductive path 108A and 108C may be a conductive coating that covers around the edge of the chuck and through a through-hole, respectively, and wraps down the side of the electrostatic chuck body. In addition, a conductive grounding layer 108B, such as a layer of sputtered aluminum or other metal, may be positioned under a ceramic layer 106 of the chuck, and may be coupled to the conductive path 108A around the edge of the chuck. The conductive grounding layer contacts ground 109, for example, using a grounding pin and/or an underlying layer of electrically conductive adhesive. The conductive grounding layer may, for example, be an aluminum layer about 0.1 to 3 microns thick. The main field area 102 of the chuck surface 103 may be a silicon-based material surface with embossments 110 that extend above surrounding areas of main field area 102. The surface resistivity between main field area 102 and ground may be in the range of from about $10^8$ to about $10^{12}$ ohms per square, for example in the range of $10^{10}$ ohms per square, while the surface resistivity between the conductive path 108A and ground is about $10^7$ ohms per square. A lower surface resistivity between the conductive path and ground is probably not detrimental, as long as the conductive path only extends a short distance onto the workpiece-contacting surface of the electrostatic chuck. Electrostatic chuck 100 may also include a base layer (as well as other embodiments described herein), for example made of aluminum. The electrostatic chuck may further include gas holes, lift pins, and other standard components (not shown).

Figure 4:
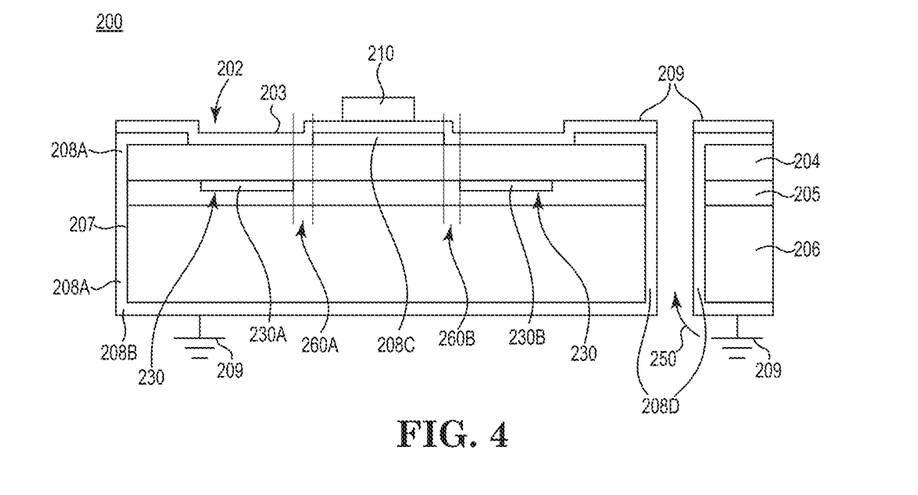
FIG. 4 is an enlarged side view of another embodiment of an electrostatic chuck which includes at least one embossment disposed above an insulative layer and over a conductive element that does not overlap a set of electrodes underneath, in accordance with an embodiment of the invention.

Referring now to FIG. 4, there is illustrated an enlarged side view of another embodiment of an electrostatic chuck 200 which includes at least one embossment 210 disposed above an insulative layer 209 and over a conductive element 208C that does not overlap longitudinally over a set of electrodes 230A and 230B disposed below or beneath insulative layer 204. In this example embodiment, chuck 200 is formed over a base substrate similar to substrate 106 from successive layers of a dielectric (such as a ceramic material) 204, a bond layer (e.g., polymer or other types of adhesive, such as a dielectric adhesive) 205 and a second insulator layer (ceramic substrate) 206. Embossment 210 is formed on main field area 202 over an insulator layer 209 that coats most of an uppermost surface 203 of chuck 200 and is formed over conductive element 208C, with conductive element 208C being formed over a first insulator layer 204. Note conductive element 208C is co-planar with an upper portion of conductive path 208A and preserves the relationship of leaving longitudinal gaps between conductors and electrodes similar to chuck 100. This configuration provides for support of a wafer substrate on one or more embossments 210 while allowing electrodes 230A and 230B to clamp the substrate during processing and then allows conductive element 208C to dissipate charges from the wafer when chuck 200 is turned off before lifting or removing the wafer substrate. Optionally, embossment 210 is coated with a conductive coating to enhance charge dissipation. Conductive path 208A located on an edge 207 of electrostatic chuck 200 and, along with a center through-hole conductor 208D, is also coupled to a conductive grounding layer 208B, with grounding layer 208B being coupled to a ground 209. Conductive grounding layer 208B is disposed below or underneath a second insulator layer 206 of the electrostatic chuck, the conductive grounding layer electrically contacting at least one conductive element 208C (or a conductive bridge of embossments 210 if so desired in a related embodiment). In this example embodiment, there is lateral spacing 260A between a top of embossment 210 and conductive element 208C and the electrode element 230A, the spacing relationship being configurable so to maximize charge dissipation from the wafer substrate upon de-energization of the electrode pattern. Similarly, laterally spacing 260B is provided between embossment 210 and conductive element 208C. Lateral spacing 260A and 260B represent the spacing or clearance (such as insulative gap 152) between a distal part of electrode 230A and a distal portion of conductive element 208C and embossment 210. In one example embodiment, the conductive grounding layer 208B electrically contacts a grounding pin or member (not shown) of electrostatic chuck 200. In this embodiment, chuck 200 optionally includes grounding conductor 208D formed in a center through-hole 250 that is coupled to ground 209.

As with chuck 100 illustrated in FIGS. 1 and 3, chuck assembly 200 is designed to support a wafer substrate thereon and, in particular, having the plurality of embossments 210 supporting the wafer substrate over main field area 202 and above the edge 207 of chuck 200. In this example embodiment, the plurality of embossments 210 are disposed laterally in from an outside edge 207 of the electrostatic chuck with each of the embossments 210 having a conductive element 208C (or optionally a conductive coating thereon), and each of conductive elements 208C potentially forming paths for charge dissipation that would be electrically coupled to ground 209. First electrode pattern 230 is disposed below or underneath the first insulator layer 204 and has electrode elements 230A and 230B that are located longitudinally below the gap portions of insulative material. Chuck 200 and electrode pattern 230 include adjacent lateral spacings or gaps 260A and 260B, the gaps being located laterally between the conductive element 208C and the electrodes. The distal portions of conductive element 208C are configured to not extend laterally over electrode elements 230A and 230B, thereby preventing electrical coupling between the electrode pattern and the conductive elements 208C located above upon energization of the electrode pattern 230. In one example embodiment, at least one of the conductive elements 208C is electrically coupled to one of the conductive grounding layer 208B or ground 209 through a longitudinal center hole 250 via conductor 208D in electrostatic chuck 200. Polymer-surface electrostatic chucks are also provided with the ability to move charges from the chuck surface, and the workpiece, to ground while maintaining the polymer/workpiece contact, avoiding metals contamination issues and permitting the electrostatic chuck surface to be refurbished. One example includes a polymer-surfaced electrostatic chuck with a surface resistivity of from about $10^8$ to about $10^{10}$ ohms per square in the main field area of the chuck surface, and a highly conductive path to ground from the edge of the chuck, for example less than about $10^4$ ohms. The various conductive paths described herein may, for example, be formed of an aluminum coating formed by physical vapor deposition (PVD) or another conductive coating such as carbon-based coatings, for example hydrogenated carbon doped with nitrogen. The adhesion coating layer may comprise at least one of silicon containing nitrides, oxides, carbides and non-stoichiometric versions of these, for example but not limited to $SiO_xN_y$, silicon nitride, silicon oxide or silicon carbide. The adhesion coating layer may also comprise carbon or a nitride compound of carbon; and may comprise diamond-like carbon. The polymer surface of the chuck may be, for example, a carbon nanotube filled polymer such as carbon nanotube filled polyether imide (PEI), polyether ether ketone (PEEK) or polyimide. The surface resistivity of the carbon nanotube surface may, for example, be in the range of from about $10^8$ to about $10^{10}$ ohms per square. The carbon nanotube surface may, for example, be formed by lamination and patterning by reactive ion etch, in a similar way to that described in Published PCT Application WO 2010/132640 A2 of Entegris, Inc., entitled "Electrostatic Chuck with Polymer Protrusions," the entire disclosure of which is hereby incorporated herein by reference. An advantage of the carbon nanotube filled polymer surface may be that the resistivity is uniform throughout the material, and will not wear off or wear out with time or with cleaning.

By providing highly conductive paths to ground, an embodiment according to the invention permits charge to bleed out of the wafer substrate and the electrostatic chuck in a sufficiently short space of time given the pace of substrate processing by the electrostatic chuck, to prevent or mitigate wafer sticking or other wafer handling problems. In this regard, it should be noted that the surface resistivity of the conductive path to ground in accordance with an embodiment of the invention should be sufficient to deliver charge to ground in the time that is permitted by a process in which the electrostatic chuck is being used. For example, a processing time of 10 seconds per workpiece versus a processing time of 1 second per workpiece will demand an order of magnitude difference in surface resistivity in order to deliver charge to ground in the requisite amount of time. For implant processes, cycle times in the tenths of seconds support the surface resistivities set forth herein, although other surface resistivities may be used as necessary.

As used herein, the term "workpiece-contacting surface" means a surface that contacts a workpiece, which is clamped by an electrostatic chuck, during use of the electrostatic chuck. An embodiment according to the invention may be used with AC and DC Coulombic chucks and Johnsen-Rahbek chucks. Further, where conductive coatings are described herein, it will be appreciated that a variety of different possible conductive materials may be used, for example, doped silicon based materials, a metal such as aluminum or another material may be used in place of carbon-based material. Polishing may be used to reduce effective surface resistivities of conductive paths. In one embodiment, a duplex structure may be formed of silicon carbide, for a main field area of the electrostatic chuck, in combination with highly doped silicon carbide for conductive paths. Electrostatic chucks according to an embodiment of the invention may be refurbished, for example, using a reactive ion etch process. Further, an embodiment according to the invention may be used in differing systems including, but not limited to, beam line ion implanters, plasma doping ion implanters, plasma immersion ion implantation systems, flood ion implanters, focused plasma systems, systems that modulate a plasma sheath, etching systems, optical based processing systems and chemical vapor deposition systems. The various electrostatic chuck assemblies described herein are configured to operate with an applied voltage source (AC or DC) in an electrostatic chuck system environment as part of a wafer processing system.

The following U.S. patents and patent publications are incorporated herein by reference in their entireties: U.S. Pat. Nos. 7,623,334; 7,724,493; 8,861,170; and 9,692,325.

Various embodiments of the invention have been described above for purposes of illustrating the details thereof and to enable one of ordinary skill in the art to make and use the invention. The details and features of the disclosed embodiment[s] are not intended to be limiting, as many variations and modifications will be readily apparent to those of skill in the art. Accordingly, the scope of the present disclosure is intended to be interpreted broadly and to include all variations and modifications coming within the scope and spirit of the appended claims and their legal equivalents.

We claim:

1. An electrostatic chuck assembly configured to support a wafer substrate thereon, the electrostatic chuck assembly comprising:
   a surface including a main field area;
   an insulative material that comprises a first insulator layer having a plurality of embossments that extend above surrounding portions of the main field area and a first conductive coating with one or more gap portions in the first conductive coating that provide uncoated insulative material that are disposed between the plurality of embossments, wherein the plurality of embossments being disposed laterally in from an outside edge of the electrostatic chuck with each of the plurality of embossments having the first conductive coating and thus constitute conductively coated embossments which form one or more conductive bridges across sets of the embossments that are electrically coupled to ground wherein the conductively coated embossments are configured to support the wafer substrate over the main field and above the outside edge of the electrostatic chuck; a first electrode pattern disposed below the first insulator layer, the first electrode pattern having electrode elements located longitudinally below the one or more gap portions and located laterally between the one or more conductive bridges of embossments, wherein distal portions of the conductively coated embossments do not extend laterally over the electrode elements so as to form a longitudinal clearance reducing electrical coupling between the first electrode pattern and the one or more conductive bridges upon energization of the first electrode pattern;
   a second electrode pattern disposed below the first insulator layer, wherein the second electrode pattern is of opposite polarity from the first electrode pattern, wherein the first and second electrode patterns are configured to clamp the wafer substrate on the one or more conductive bridges of embossments upon energization;
   a plurality of conductive bridge paths formed from the electrically coupled plurality of embossments disposed in an interleaving configuration with electrodes within each of the first electrode pattern and the second electrode pattern; and
   an insulative body configured to support the first electrode pattern and the surface having the conductively coated embossments.

2. The electrostatic chuck according to claim 1, wherein a lateral space between a top of the conductively coated embossments and the electrode elements is configured to maximize charge dissipation from the wafer substrate upon de-energization of the electrode pattern.

3. The electrostatic chuck according to claim 1, wherein the at least one of the one or more conductive bridges is electrically coupled to one of a conductive grounding layer or ground through a longitudinal hole in the electrostatic chuck.

4. The electrostatic chuck according to claim 1, further comprising a conductive path covering at least a portion of the outside edge of a workpiece-contacting surface of the electrostatic chuck, the conductive path comprising a second conductive coating electrically coupled to a conductive grounding layer.

5. The electrostatic chuck according to claim 1 further comprising a gas seal ring on the surface, wherein a conductive path covers at least a portion of the gas seal ring of the electrostatic chuck.

6. The electrostatic chuck according to claim 1, wherein a conductive path comprises one of a carbon-based material, a doped carbon material, or hydrogenated carbon doped material with nitrogen.

7. The electrostatic chuck according to claim 1, wherein the first conductive coating on the plurality of embossments is one of a metallic material or a conductive charge dissipating material.

8. The electrostatic chuck according to claim 1, wherein the main field area comprises one of a silicon-based or a polymer.

9. The electrostatic chuck according to claim 1, wherein the one or more gap portions are disposed directly over the electrode elements to reduce clamping between the electrode elements and the conductively coated embossments.

10. An electrostatic chuck assembly configured to support a wafer substrate thereon, the electrostatic chuck assembly comprising:
   a surface including a main field area comprised of an insulative material forming a first insulator layer having at least one embossment that extends above surrounding portions of the main field area and a first conductive coating with one or more gap portions in the first conductive coating that provide uncoated insulative material between the embossments, the at least one embossment being disposed laterally in from an outside edge of the electrostatic chuck with the first conductive coating disposed thereon, wherein a conductively coated embossment is electrically coupled to ground through a longitudinal hole in the electrostatic chuck, wherein a second conductive coating extends along and covers a sidewall of the longitudinal hole, and wherein the conductively coated embossment is configured to support the wafer substrate over the main field and above the outside edge of the electrostatic chuck; and
   a first electrode pattern disposed below the first insulator layer, the first electrode pattern having electrode elements located longitudinally below the one or more gap portions and located laterally away from the conductively coated embossment, wherein distal portions of the conductively coated embossment or the first conductive coating thereon do not extend laterally over the electrode elements so as to form a longitudinal clearance to prevent reduce electrical coupling between the first electrode pattern and the conductively coated embossment upon energization of the first electrode pattern.

11. The electrostatic chuck assembly of claim 10, wherein the first conductive coating is one of a metallic material or a conductive charge dissipating material.

12. The electrostatic chuck assembly of claim 11, further comprising a conductive path covering at least a portion of an outside edge of a workpiece-contacting surface of the electrostatic chuck, the conductive path comprising a third conductive coating electrically coupled to an electrical path to ground.

13. The electrostatic chuck assembly of claim 10, wherein the one or more gap portions are disposed directly over the electrode elements to reduce clamping between the electrode elements and the conductively coated embossments.

* * * * *